United States Patent
Deubzer

(10) Patent No.: US 9,405,864 B2
(45) Date of Patent: Aug. 2, 2016

(54) METHOD FOR A DESIGN EVALUATION OF A SYSTEM

(71) Applicant: Michael Deubzer, Regensburg (DE)

(72) Inventor: Michael Deubzer, Regensburg (DE)

(*) Notice: Subject to any disclaimer, the term of this patent is extended or adjusted under 35 U.S.C. 154(b) by 22 days.

(21) Appl. No.: 14/056,424

(22) Filed: Oct. 17, 2013

(65) Prior Publication Data
US 2014/0052432 A1 Feb. 20, 2014

Related U.S. Application Data

(63) Continuation of application No. PCT/EP2012/053242, filed on Feb. 27, 2012.

(30) Foreign Application Priority Data

Apr. 23, 2011 (DE) .......................... 10 2011 018 491

(51) Int. Cl.
*G06F 9/48* (2006.01)
*G06F 17/50* (2006.01)
*G06F 9/50* (2006.01)
*G06Q 10/06* (2012.01)
*H04L 12/24* (2006.01)

(52) U.S. Cl.
CPC .......... *G06F 17/5009* (2013.01); *G06F 9/4881* (2013.01); *G06F 9/5038* (2013.01); *G06F 17/5022* (2013.01); *G06Q 10/063112* (2013.01); *H04L 41/145* (2013.01)

(58) Field of Classification Search
None
See application file for complete search history.

(56) References Cited

U.S. PATENT DOCUMENTS

| | | | |
|---|---|---|---|
| 3,648,253 A * | 3/1972 | Mullery et al. | 718/100 |
| 5,050,069 A | 9/1991 | Hillis et al. | |
| 6,058,414 A * | 5/2000 | Manikundalam et al. | 718/104 |
| 6,757,897 B1 * | 6/2004 | Shi et al. | 718/102 |
| 6,907,606 B1 * | 6/2005 | Jang | G06F 9/542 718/103 |
| 7,877,751 B2 * | 1/2011 | Maeda et al. | 718/102 |

(Continued)

FOREIGN PATENT DOCUMENTS

| | | |
|---|---|---|
| DE | 38 82 990 T2 | 11/1993 |
| DE | 102 58 655 | 7/2003 |

(Continued)

OTHER PUBLICATIONS

M. Ghasemazar, E. Pakbaznia, M. Pedram, "Minimizing the Power Consumption of a Chip Multiprocessor under an Average Throughput Constraint", pp. 1-10, 2010 IEEE.*

(Continued)

*Primary Examiner* — Kibrom K Gebresilassie
(74) *Attorney, Agent, or Firm* — Davidson, Davidson & Kappel, LLC

(57) ABSTRACT

A method for the design evaluation of a system is described. The system is modelled and simulated on at least one computer. The model (1) of the system includes at least two functional units (40), each functional unit (40) capable of performing at least one type of task, and at least one scheduling unit (30), capable of assigning at least one task to at least one functional unit (40). At least one scheduling unit (30) is capable of assigning tasks to plural targets, wherein each target either is a functional unit (40) or a scheduling unit (30). Preferentially, the system is simulated by taking into account only instants of time (81) at which a state of the model (1) changes. External and internal stimuli (50) may be included in the simulation. The method may be used for optimizing the design of a system.

16 Claims, 6 Drawing Sheets

(56) References Cited

U.S. PATENT DOCUMENTS

| | | | |
|---|---|---|---|
| 7,921,248 B2 | 4/2011 | Brinksmeier et al. | |
| 7,962,356 B2 | 6/2011 | Bollenbeck et al. | |
| 7,987,075 B2* | 7/2011 | Sugure et al. | 703/2 |
| 8,271,984 B2 | 9/2012 | Stolpe | |
| 8,381,004 B2* | 2/2013 | Elnozahy et al. | 713/321 |
| 8,428,928 B1* | 4/2013 | McGaughy | G06F 17/5036 703/14 |
| 8,457,944 B2 | 6/2013 | Mangold et al. | |
| 8,832,479 B2* | 9/2014 | Elnozahy et al. | 713/321 |
| 9,185,063 B1* | 11/2015 | Kumar | H04L 51/046 |
| 2002/0095221 A1* | 7/2002 | Cook | G05B 9/03 700/4 |
| 2004/0032857 A1 | 2/2004 | Tannan | |
| 2005/0223384 A1* | 10/2005 | Klingman | 718/107 |
| 2006/0227771 A1* | 10/2006 | Raghunath et al. | 370/389 |
| 2006/0277090 A1 | 12/2006 | Bollenbeck | |
| 2007/0129929 A1* | 6/2007 | Nakamura et al. | 703/22 |
| 2007/0233286 A1* | 10/2007 | Ishikawa et al. | 700/29 |
| 2007/0288485 A1* | 12/2007 | Shin | G06F 17/30115 |
| 2009/0327944 A1* | 12/2009 | Sugure et al. | 715/772 |
| 2010/0030546 A1* | 2/2010 | Dong | B60R 16/0207 703/14 |
| 2010/0043000 A1* | 2/2010 | Chrysanthakopoulos | G06F 9/4887 718/102 |
| 2010/0057511 A1* | 3/2010 | Mansouri | G06Q 10/06311 705/7.13 |
| 2010/0198690 A1* | 8/2010 | Gilvar et al. | 705/14.58 |
| 2010/0332796 A1* | 12/2010 | Gaiarsa et al. | 712/30 |
| 2011/0289503 A1* | 11/2011 | Toub et al. | 718/102 |
| 2011/0296212 A1* | 12/2011 | Elnozahy et al. | 713/320 |
| 2012/0173906 A1* | 7/2012 | Elnozahy et al. | 713/320 |
| 2012/0180061 A1* | 7/2012 | Rao et al. | 718/104 |
| 2012/0180068 A1* | 7/2012 | Wein et al. | 718/106 |
| 2012/0210325 A1* | 8/2012 | de Lind van Wijngaarden et al. | 718/103 |
| 2013/0117754 A1* | 5/2013 | Kurihara et al. | 718/102 |

FOREIGN PATENT DOCUMENTS

| | | |
|---|---|---|
| DE | 10 2006 023 754 | 12/2006 |
| DE | 603 10 048 T2 | 8/2007 |
| DE | 10 2006 010 400 | 9/2007 |
| DE | 10 2008 030 163 | 12/2009 |
| DE | 20 2009 011 267 | 12/2009 |
| DE | 10 2008 046 096 | 6/2010 |

OTHER PUBLICATIONS

M. Ghasemazar, E. Pakbaznia, M. Pedram, "Minimizing the Power Consumption of a Chip Multiprocessor under an Average Throughput Constraint", pp. 362-371, 2010 IEEE.*

Mulas et al.:"Thermal Balancing Policy for Multiprocessor Stream Computing Platforms", IEEE Transactions on Computer Aided Design of Integrated Circuits and Systems, IEEE Service Center, Piscataway, NJ, US, vol. 28, No. 12, Dec. 1, 2009.

* cited by examiner

METHOD FOR A DESIGN EVALUATION OF A SYSTEM

This application is filed under 35 U.S.C. §120 and §365(c) as a continuation of International Patent Application PCT/EP2012/053242, filed Feb. 27, 2012 claiming priority to German Patent Application No. 10 2011 018 491.0, filed Apr. 23, 2011, both of which are incorporated herein by reference in their entireties.

The present invention relates to a method for the design evaluation of a system. In particular, the present invention relates to such a method which involves the simulation of the system on at least one computer.

BACKGROUND

The German published patent application DE 10 2008 030 163 A1 discloses a method for the simulation of an embedded system comprising plural processing elements. The embedded system is modeled on a host computer. Each processing element has a scheduler selecting the next process to be executed on the specific processing element from a list of processes assigned to the processing element. The processing elements to be simulated are selected by a scheduler which is part of the host computer, not of the simulated embedded system. Migration of processes between processing elements is not possible in the model of the embedded system.

The published US patent application US 2007/0129929 A1 describes the simulation of a hardware or software system using a multitasking computer code. The method is based on the times required for the execution of the simulated tasks.

The German published patent application DE 10 2006 023 754 A1 discusses a method for optimizing the assignment of staff to specific tasks, in particular in the context of a call centre. The quality of each specific assignment is assessed based on a number of criteria. A simulation of the activities, for example in a call centre, is not carried out.

The German published patent application DE 10 2006 010 400 A1 is concerned with finding an optimized scheduling plan for a distributed time-triggered computer network. An essential part of the method is the analysis of dependencies between elements of the system.

The German published patent application DE 102 58 655 A1 discloses a method for model based planning and optimization of manufacturing processes. The method is mainly concerned with predicting delivery times of goods ordered to be manufactured, including also the possibility to change an initial plan for the manufacture of specific items if disruptions occur in the manufacturing system.

The German published patent application DE 10 2008 046 096 A1 refers to a method for determining suitable requirements for at least one hardware unit of a computer system. The at least one hardware unit is modeled using varying operation parameters, and the performance resulting from a specific set of operation parameters is monitored. The variation of the operation parameters aims at fulfilling desired performance criteria.

The German utility model DE 20 2009 011 267 U1 discusses a device for configuring a time-triggered bus system. The bus system comprises at least two bus nodes and a data bus connecting the bus nodes. On each bus node at least one node task and at least one transmission task can be executed.

The German translation DE 603 10 048 T2 of the European patent EP 1 488 652 B1 regards a method, apparatus, and system for the simulation of mixed traffic in a wireless network. The mixed traffic comprises switch-based traffic and packet-based traffic.

The German translation DE 38 82 990 T2 of the European patent EP 0 358 704 B1 concerns a method and apparatus for the simulation of M-dimensional connection networks in an N-dimensional network, where M is less than N. The method refers in particular to the control of a parallel processor.

The article "Minimizing the Power Consumption of a Chip Multiprocessor under an Average Throughput Constraint" by M. Ghasemazar et al, 11th International Symposium on Quality Electronic Design (ISQED), pages 362-371, 2010, IEEE, Piscataway, N.J., USA, discloses the simulation of a computer system in which a scheduling unit assigns tasks to two further scheduling units, each of which in turn assigns tasks to plural functional units.

In many fields of technology systems which exhibit high design complexity are commonplace. System here is to be understood in quite broad a sense, and includes for example computer systems, manufacturing systems, networks, or the organization of collaboration between plural individuals. Computer systems may be any kind of computer system, in particular multi-core or multi-processor systems, which in either case may be embedded or non-embedded systems. Manufacturing systems may include any apparatus used for the manufacture of goods, but may also include plural production sites each of which contributes to the production of an end product. Networks can be any type of network, like communication networks, pipelines, power-lines, passenger transport networks, cargo transport networks. The organization of collaboration between individuals in particular includes the assignment of tasks to specific individuals in coordination with the assignment of tasks to different individuals, depending on the qualifications of the respective individual.

Design evaluation of a system includes that a system not yet existing in reality but only planned or designed is evaluated with respect to characteristics like performance to be expected of the system once it has been built, furthermore includes the evaluation of an existing system to determine specific characteristics of the system, and also the planning of operations on an existing system in order to determine how a given objective might most efficiently be achieved on the existing system. Naturally, also combinations of the above possibilities are included. As one example, in order to achieve a given objective, not only may an existing system be taken as fixed, but also some modifications to the system might be considered.

SUMMARY OF THE INVENTION

Prior art methods for the design evaluation of a system are limited as they cannot take into account complexities that arise in certain types of system that are increasingly used, like for example multi-core computer systems.

It is an object of the present invention to provide a method for the design evaluation of a system, where the system comprises plural functional units and exhibits assignment of tasks to functional units more complex than each scheduling unit of the system assigning tasks to one respectively fixed functional unit.

The present invention provides a method for the design evaluation of a system comprising the following steps:

providing the system with at least two functional units wherein each functional unit capable of performing at least one type of task, and at least one scheduling unit capable of assigning at least one task to at least one functional unit, wherein at least one scheduling unit is capable of assigning tasks to plural targets, each target being either a functional unit or a scheduling unit;

providing as a set of parameters a description of the system to at least one computer;

running a simulation of the system on the at least one computer;

generating output representing simulation results; and taking into account in the simulation the capability of at least one scheduling unit for removing a task from a target and assigning it to a different target.

It is also an object to provide a method for optimizing such a system.

The present invention thus also provides a method for optimizing a system, comprising the steps of:

defining optimization targets, providing the system with at least two functional units wherein each functional unit capable of performing at least one type of task, and at least one scheduling unit capable of assigning at least one task to at least one functional unit, wherein at least one scheduling unit is capable of assigning tasks to plural targets, each target being either a functional unit or a scheduling unit;

providing as a set of parameters a description of the system to at least one computer;

running a simulation of the system on the at least one computer;

generating output representing simulation results;

taking into account in the simulation the capability of at least one scheduling unit for removing a task from a target and assigning it to a different target;

evaluating the simulation results; and modifying the set of parameters describing the system for the simulation depending on the simulation results, and the simulation is reiterated, until optimization targets are achieved to a degree desired by a user.

The method according to the invention is based on a simulation, of the system on at least one computer. The at least one computer can be a single-core, multi-core, single-processor or multi-processor computer. The system can also be simulated on a local cluster of computers, or on a plurality of computers connected at least temporarily via a network. As has been indicated above, the meaning of system within the context of this application is rather broad. On a more abstract level, the systems this application is concerned with comprise at least two functional units and at least one scheduling unit. A functional unit is a unit which is capable of performing at least one type of task. A scheduling unit can be a unit capable of assigning at least one task to at least one functional unit, for this task to be performed on the respective functional unit. For example, a functional unit may be a processor core in a computer system, and a corresponding task may be the execution of a thread. Assigning the task of the example to the functional unit of the example means that the thread is executed on the processor core. Further examples can be found below. A scheduling unit can also be a unit capable of assigning a task to at least one further scheduling unit.

At least one scheduling unit is capable of assigning tasks to plural targets, wherein each target either is a functional unit or a scheduling unit. An example of a scheduling unit assigning tasks to plural functional units can be found in multi-core processors. A further example, in the context of a group of collaborating people, would be a manager assigning different tasks to different individuals of the group. In this same context, a scheduling unit assigning tasks to a different scheduling unit would correspond to a manager of the group assigning tasks to the manager of a sub-group, who in turn may assign the tasks to individuals of the sub-group. In the context of a computer system, the computer system may be configured such that a scheduler which is capable of assigning tasks to processor cores in addition can also assign tasks to a different scheduler, which for example may assign the tasks to a different group of processor cores. Alternatively, the computer system may implement hierarchical scheduling, wherein scheduling units of a first tier do not assign tasks to functional units directly, but to scheduling units of a second tier. The scheduling units of the second tier, dependent on the configuration of the system, may assign tasks to functional units or to yet further scheduling units.

In any case, assignment of a task to a functional unit preferentially takes account both of the specific requirements of the task and the corresponding specific capabilities of the functional unit, i.e. only those functional units will be considered for assignment the specific capabilities of which match the specific requirements of the task. For example, if the task comprises performing some calculation on a processor core in a computer, wherein the calculation requires input data stored on a specific hard drive, a scheduling unit may consider only those functional units, i.e. processor cores in this example, which have read access to the specific hard drive. In an embodiment of the method a ranking of functional units dependent on how well they match the requirements of a given task is considered for scheduling. In the example, those processor cores might be preferred which have the fastest access to the hard drive, and only if these cores are occupied and should not be interrupted will cores with a slower connection be considered.

Also, if a scheduling unit assigns a task to a further scheduling unit, it may consider both the specific scheduling properties of the further scheduling unit and the specific capabilities of functional units the further scheduling unit can assign tasks to.

It should be realized that in many real systems scheduling itself requires some effort and does constitute a task in itself. In such a system a scheduling unit may actually be a separate unit, a piece of hardware, for example, dedicated to scheduling. A scheduling unit of the real system, as an alternative, may also be a collection of tasks, represented in software, for example, that need to be executed on functional units for the scheduling unit to operate. Combinations of these alternatives are of course also possible. Embodiments of the method according to the invention take this into account and simulate the operation of a scheduling unit as a number of tasks to be executed on a functional unit. This can be the case for a computer system, but for example also for the manager of a group of people. Drafting a plan on how to distribute work to the members of a group is a task in itself, carried out by the manager. In addition, the manager may also assign workload to himself other than the distribution of work to the members of the group. In this way the manager can be considered a functional unit that in addition performs scheduling tasks.

The simulation of the system requires a description of the system in terms of a set of parameters, which are supplied to the at least one computer; this description may for example be supplied to the at least one computer in a language like XML, AUTOSAR, EAST-ADL, but any form of computer-readable description will do. Then, a simulation of the system is run on the computer, and the results of the simulation are provided as output, According to the invention the method takes into account in the simulation the capability of at least one scheduling unit of the system to remove a task from a target and to assign it to a different target. It is in particular due to this migration of tasks between targets that scheduling prescriptions can be considered in the simulation wherein the scheduling prescriptions are far more flexible than those prescriptions considered in prior art models. In the context of a computer system, for example, the migration of a task means that, for example, a thread is started on a first core, and after some time, before having terminated, is stopped on the first core, and transferred to a second core, where its execution continues. In the context of a manufacturing system, for example, the manufacturing process of a specific end product, which started on and could in principle entirely be done within a single production line, might be interrupted on the starting production line and continue on a different one. The reasons for such an interruption can be manifold, for example it may be that a disruption occurred on the starting production line, or that some routine maintenance work is to be carried out on the starting production line.

In many system configurations to each scheduling unit there corresponds a group of targets the scheduling unit has available for assigning tasks to. This group of targets may be fixed for certain system configurations. In other system configurations, the group of targets a specific scheduling unit can assign tasks to can be changed. The possibility of such a change is taken into account in an embodiment of the method according to the invention. In the context of an embedded computer system in a motor vehicle, for example, such a change of the group of targets can be advantageous in emergency situations. Assume for simplicity that there are a first and a second scheduling unit in the embedded system. The first scheduling unit assigns tasks to a first group of functional units, wherein the tasks are for entertainment purposes. The second scheduling unit assigns tasks to a second group of functional units, wherein the tasks concern the monitoring of the vehicle motion and the control of emergency systems like an air bag. For most of the time, the monitoring of the vehicle motion does not require much computing power, usually less than is required for entertainment. If the monitoring of the vehicle motion indicates an emergency, like a collision or potential collision, many more calculations have to be done in relatively short time than under non-emergency conditions. In such a case some or all functional units of the first group could be made available to the second scheduling unit for assigning tasks to them in addition to the functional units of the second group. Alternatively, in such a case the second scheduling unit could also assign tasks to the first scheduling unit, which would in turn assign the tasks to functional units of the first group.

The tasks which are assigned to targets can for the purposes of simulation be broken down into sub-tasks. The granularity to which this is done depends on the model employed by a user of the simulation method according to the invention. Ideally, this granularity matches the granularity which is achievable in the system to be simulated. The migration of tasks from one target to a different one then occurs between such sub-tasks in the simulation. A sub-task being executed on a functional unit is allowed to finish, and if the task is to be migrated, the next sub-task either is assigned to a different functional unit or a different scheduling unit. Note that here we have chosen more economical language, speaking of the tasks and functional units as if referring to the real system, rather than stating that the simulation method carries out steps which in the simulation model represent the execution of a task on a functional unit up to a certain sub-task and the continuation of the task on a different functional unit. We will often use such less cumbersome language below. In the case that two sub-tasks of a task do not depend on each other, so that the temporal order in which they are executed is irrelevant, these sub-tasks may also be executed in parallel on different functional units, or the order in which these sub-tasks are executed on a single functional unit may be changed. Furthermore, a sub-task may create further sub-tasks or entire process-instances.

Scheduling prescriptions employed by scheduling units may comprise combining plural sub-tasks into blocks of sub-tasks, and consider such blocks as the sections of a task scheduling is done on.

In order that the simulation provides results useful for evaluation, each task or sub-task is assigned a cost. Such a cost may either be a fixed quantity or sampled from a distribution, and may be a single-component or multi-component quantity. For example, the cost for a sub-task may comprise the time required to execute the sub-task, the energy required and quantities of possible raw materials required. It may also comprise a measure of the wear the execution of the sub-task implies for the functional unit. In case of a complex system, it may not be possible to assign precise cost values. In such a case, in particular, sampling of cost values from a statistical distribution is advantageous. The statistical distribution then captures for the purposes of the simulation all those effects in connection with the given sub-task which the model of the system does not describe explicitly. Such statistical distributions can be provided as part of the parameters describing the system to the at least one computer used to simulate the system. The statistical distribution can be obtained from a theoretical model or empirically. The cost assigned to a specific sub-task may also be provided as a set of parameters which describe the actual cost in dependence on characteristics of functional units and/or a state of the system. As a simple example, executing a specific sub-task on two different functional units may require different amounts of time or energy. The actual amounts of time or energy used in the simulation when the sub-task is assigned to a specific functional unit then are obtained from the cost parameters of the sub-task and characteristics of the specific functional unit. The state of the system may for example comprise the temperature of components of the system or the availability of resources. If a sub-task has to wait for a resource to become available, the time the sub-task requires to execute depends on the time the sub-task has to wait.

In embodiments the method takes into account events generated outside the system. In this way the reaction of the system to external stimuli can be studied in the simulation. In the case of the embedded system in a motor vehicle discussed above, for example, the model could be supplied with input that models an imminent collision, and it could then be studied, whether the configuration of the embedded system including the scheduling prescriptions in force in the embedded system are suitable to trigger an adequate reaction of the system within a pre-defined time-limit. An adequate reaction in this example could be generating a control signal which would, in the real system, cause the air bag to inflate. Generally speaking, the method of the invention is suitable for evaluating the real-time behavior of systems, costs incurred by running the system, and the reliability of systems. The costs incurred refer to, for example, energy or time requirements for a task, usage of resources, like a computer memory, hard drive, or a virtual resource. The reliability of the system can be evaluated for example by stressing the system with stimuli or by studying the effects of changes in the costs assigned to sub-tasks on the behavior of the system.

While a collision in the context of a motor vehicle clearly is an effect from outside the vehicle, the outside of the system can also include everything not taken into account explicitly in the model of the system, though possibly part of the real system, but substituted by input provided to the simulated system by explicit user interaction or by the execution of some encompassing simulation program of which the simulation of the system itself is only a part.

In addition, the real system may also make use of internal stimuli, which signal changes of the state of components of the system and thus indicate a change of the system state. Internal stimuli thus serve as a means of communication between parts of the system. This type of communication can be included in the model of the system. Internal stimuli for example indicate the becoming available of specific resources; an internal stimulus may also be generated by a sub-task executed on a functional unit and lead to the creation of further sub-tasks on the same or a different functional unit.

For some systems stimuli are considered which occur at certain time instants; these may be triggered at corresponding values of the time in the simulation. Some stimuli occur repeatedly whenever specific parameters of the state of the system satisfy predefined conditions, for example, whenever these parameters assume certain values. For the simulation of some systems it can be advantageous to use these parameters as an alternative time variable. A specific example for such a system is a car engine, and a specific stimulus in the system is triggered whenever the engine completes a round. The time difference between subsequent stimuli then depends on the rotation speed of the engine. Here the position of the engine along its rounds can be used as an alternative time, so that the specific stimulus is triggered at constant intervals of this alternative time. This is often easier to implement. The connection with the overall time in the simulation can be established, when required, via the rotation speed of the engine.

Furthermore, blocking mechanisms in the system may be taken into account in the simulation of the system. It may for example occur that two functional units require access to the same resource. For example, in a computer system, two functional units may be executing a task each, and each task requires write access to one and the same file on a storage element. Then write access to the file for one task may be blocked until the other task has completed writing. Blocking may also be employed as a means of synchronization between functional units. For example, a first functional unit may be executing a first task, and a second functional unit may be executing a second task, wherein the tasks are such that the first task requires specific results obtained over the course of the execution of the second task. Then at a stage of execution of the first task at which these results are required, the further execution of the first task will be blocked, until the second task can provide the required results, and these results are actually available to the first task. In the case that such a situation arises in a computer system, for example, the results of the second task will have to be transmitted from the first functional unit to the second functional unit. Depending on the computer system, this may for example occur via shared memory, a bus, or a network. Depending on the model of the system, this transmission may for example be modeled explicitly, or taken into account as an additional time required after the second task generated the required results, or may be ignored.

Several examples of a system to be considered for simulation according to the method of the invention have already been mentioned above.

In particular, the system may be a computer system. In this case, the functional units can be processing units like for example processor cores, storage elements like main computer memory, cache memory, hard drives, flash memory, or bus elements. Of course, the system simulated can have functional units of different type, in particular any combination of the aforementioned possibilities.

In a computer system, each of the sub-tasks a task is broken into may be assigned a cost, which in this case advantageously comprises at least a number of cycles required to execute the respective sub-task. If such a sub-task is executed on processing units exhibiting different clock cycles, then, with the number of cycles required to execute the sub-task fixed, different times for completion of the sub-task result. This is an example of the case discussed in a more general context above, that the time required for execution of a sub-task is obtained from combining a cost parameter of the sub-task (the cycles required for execution of the sub-task in this case) with characteristics of the specific functional unit (the clock cycle of the processing unit in this case) the sub-task is executed on. The cost can furthermore comprise an energy required to execute the sub-task. This may be important, if thermal considerations are relevant in the computer system. If temperatures of components of the computer system are important, these temperatures preferentially are taken into account in the model of the system as part of the state of the system. The time necessary to execute a sub-task requiring a specific number of cycles, as specified as a component of the cost of the sub-task, on a given processing unit may depend on at least some of these temperatures. A possibility for such a dependence is that the simulation takes into account that the clock cycle of the processing unit may vary with the temperature of the processing unit due to physical effects that occur for the real processing unit in dependence on the temperature.

For many processing units an explicit change of the clock cycle by a corresponding instruction is possible, and an advantageous embodiment of the method takes this possibility into account in the simulation. Changes of clock cycles may for example be important if there are tasks which need to be executed quickly, so an increase of the clock cycle of some or all processing units executing sub-tasks of the task in question may be an option. On the other hand, an increased clock cycle implies an increased power consumption of the processing units, which in turn can lead to increased temperatures of the system. A simulation method taking into account the change of clock cycles allows to study various options, like which of the processing units will have their clock cycles increased and how this can be combined with various scheduling approaches.

For storage elements, the cost may include the time required to write data to and read data from the storage elements, as well as the amount of data stored in a respective storage element, or of percentage of available memory occupied by specific data stored.

For bus elements, the capacity of the bus, and the timing of transmission of information over the bus can be taken into account in the simulation. This may include the time required to actually put data on the bus and read data from the bus.

In specific embodiments the computer system is an embedded system. For embedded systems thermal considerations are particularly relevant, as in many situations in which embedded systems are employed cooling possibilities are limited. Embedded systems are also often used in contexts where real-time requirements have to be kept. The case of the motor vehicle mentioned above is one example. The method according to the invention in particular allows to study the real-time properties of embedded systems before these systems actually have to be built. So different configurations of the system can be studied and their design evaluated at much lower effort and cost than if all configurations tried actually had to be built.

In other embodiments the system is a transport network. The functional units are connections in the transport network, and the scheduling units select alternative routes between nodes of the network.

Transport here can refer to the transport of passengers, cargo, and information. For any of these possibilities, connections between nodes of the network can involve different means of transport.

In the case of passenger transport for example, the nodes can be destinations passengers may choose to travel to. Different routes may be available between a starting point and a final destination, and connect via any number of intermediate nodes. The method according to the invention can be used to simulate the network, including which connections are actually operated and if so, at what time intervals the connections are operated. In this way, for example, bottlenecks can be identified. The method can of course be applied to already existing networks as well as to networks still in the planning stage. The passenger transport network can be any type of such network, for example national railway grids, municipal underground networks, regional and local bus networks, or flight or ship routes, or roads. Also combinations of different types of transport can be taken into account. Transport networks can also include systems of lifts, staircases and emergency exits in skyscrapers or other buildings. In any case, guide systems might be applied to direct streams of passengers along certain routes or individuals to particular emergency exits, the guide systems here fulfilling the role of scheduling units. The method according to the invention allows the test of various scheduling approaches.

Basically, what has just been said for passenger transport also applies to cargo transport. Cargo may include any type of goods or raw materials, as well as mail items.

Information networks include at least internet based networks and phone networks. Traffic on such networks can be simulated, for example to identify risks of congestion and to be able to provide properly dimensioned hardware for handling the network traffic.

The system to be simulated can also be a number of collaborating persons, in which each person is qualified for at least one task. Such persons, or a group of such persons, in the model of the system, correspond to functional units. Scheduling units in this context would be managers or management systems distributing tasks to individuals or a group of persons according to the qualifications of such an individual or the qualifications present in the respective group. A management system could be any means of making such a distribution of tasks automatically, and may include simple, fixed distribution plans as well as complex computer based workload management software. The method according to the invention can simulate the possibilities for the distribution of tasks, including various scheduling approaches employed by managers or management systems, and can for example take into account various possibilities of the composition of groups, e.g. which qualifications are combined into one group.

The method according to the invention can also be applied to systems where each functional unit is a production or manufacturing device configured to perform at least one task within a manufacturing process, and the scheduling units distribute workload to the production or manufacturing devices. Therein the method may also take into account transport requirements between different production sites.

The system to be simulated can also be an energy supply system. Each functional unit of the energy supply system may be an energy production unit, or an energy storage unit, or an energy transfer unit, or an energy consumer. Scheduling units control the production of energy as well as the distribution of energy to energy storage units and to energy consumers. Energy production units may for example be any type of power plant. Energy consumers can be any appliance or apparatus requiring energy, and may include electric vehicles, in particular electric cars. Energy transfer units include power lines, in principle from the energy producer up to the energy consumer or energy storage unit, but may also include distribution networks for substances storing energy, like hydrogen. These distribution networks may be pipes, but also transport networks for tanks of such substances, on rail or road, for example. Energy storage units can be tanks or reservoirs of substances storing energy, like hydrogen, or may for example be accumulators. In particular, accumulators in parked electric vehicles can be considered for the storage of energy.

The simulation method according to the invention can also be used in an optimization method for a system. Thereunto, optimization targets are defined, the system is simulated with the simulation method according to the invention, and the results of a simulation run are evaluated. In dependence on the result of a simulation run the set of parameters describing the system for the simulation is modified, and the simulation is reiterated, until the optimization targets are achieved to a degree desired by a user. The modification of the parameters describing the system may for example be done according to a Monte-Carlo method, simulated annealing, genetic algorithms, and of course systematic exploration of the parameter space available. For any of these general methods, the modification of the parameters may also be influenced by prior knowledge of the model of the system.

BRIEF DESCRIPTION OF THE DRAWINGS

In the following the invention will be illustrated in more detail with reference to specific embodiments and accompanying drawings. Though the examples described below will refer to applications of the method according to the invention to the simulation of computer systems, this is not to be taken as a limitation of the invention.

FIG. 6 schematically shows a change of the set of functional units a scheduling unit can assign tasks to.

DETAILED DESCRIPTION

Figure 1:
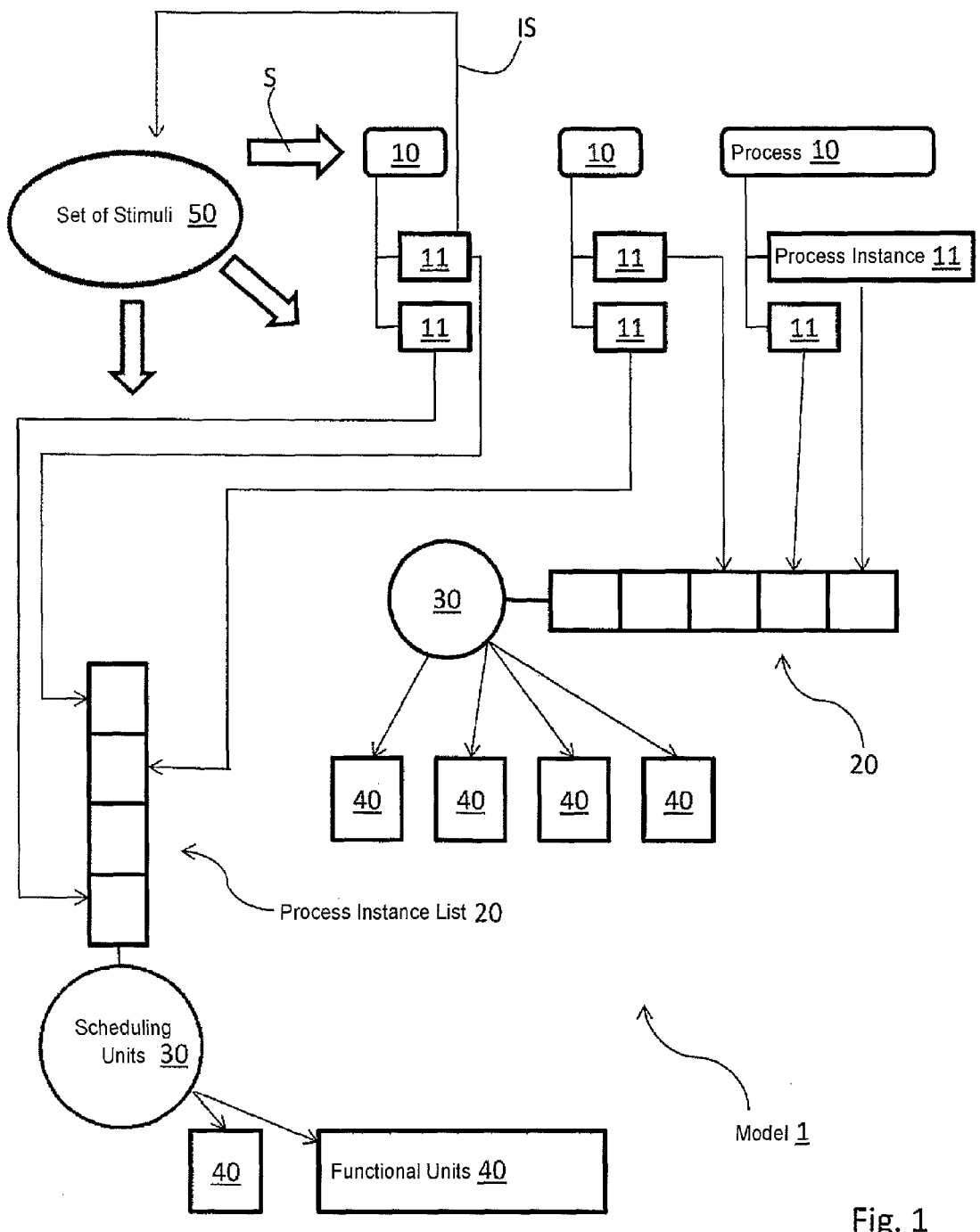
FIG. 1 is a schematic overview of the model of a system as applied in the method of the invention.

FIG. 1 is a schematic overview of the model 1 of a system as applied in the method of the invention. In the embodiment shown, the model 1 comprises functional units 40, scheduling units 30, process instance lists 20, processes 10, process instances 11, and a set of stimuli 50. The tasks of the method of the invention in the embodiment shown are described by the processes 10 and process instances 11. Processes 10 and process instances 11 are represented as data structures in the model. A process 10 refers to a general type of task, like reading from a specific storage device, and a process instance 11 is a specific example of the general type, like reading a particular file or a defined number of bytes from the storage device; process instances 11 are derived from processes 10. Process instances 11 may have the capability of creating further process instances 11, which may be of a different type; for example, a process instance 11 carrying out a specific calculation may, as result of the evaluation of a conditional expression, request data from a storage device, and therefore create a process instance 11 for reading the specified data from the storage device. Such a storage device can be represented as a functional unit 40 in the model. At any time during the simulation there can be plural process instances 11 for a given process 10. It is, to a certain degree, a choice at the time the model is built, where the line between processes 10 and process instances 11 is drawn, depending on which information is provided in the process 10 itself, and which information is added when a process instance 11 is derived from the process 10. It may also be the case that upon derivation of a process instance from a process no additional information is added to the process instance, so that the information in the process instance is a copy of the information in the process. Eventually, process instances 11 are entered into process instance lists 20; one process instance list 20 exists for each scheduling unit 30 in the model. In FIG. 1 two scheduling units 30 are shown. Each scheduling unit 30, from its respective process instance list 20, assigns process instances 11 to functional units 40. In the example of FIG. 1, to each scheduling unit 30 there corresponds a number of functional units 40, to which a respective scheduling unit 30 can assign tasks. The step of assigning a process instance 11 to a functional unit 40 means executing this process instance 11 on the functional unit 40, or, more precisely, as the invention refers to a method for the simulation of a system, simulating the execution of the process instance 11 on the functional unit 40.

The set of stimuli 50 is provided in the model 1 to represent events external to the model representation of the system simulated. These events can be events that have causes outside the real system which is simulated, in the case of an embedded system in a motor vehicle for example the detection of an imminent collision of the vehicle with an obstacle, or events that have their origin within components of the real system, wherein these components, however, are not modeled in detail in the simulation. The model 1 in FIG. 1 is such that stimuli 50 can affect any part of the model 1, as indicated by the arrows S.

The set of stimuli 50, in addition to the external stimuli, may also contain internal stimuli, which, as has already been mentioned, indicate changes of the state of the system. Such internal stimuli can be created by process instances 11, as indicated by the arrow IS. An internal stimulus may lead to further changes in the state of the system, for example the creation of further process instances 11, the change of assignment of tasks to functional units 40 or to scheduling units 30, the becoming available or unavailable of resources (modeled as functional units 40).

Figure 2:
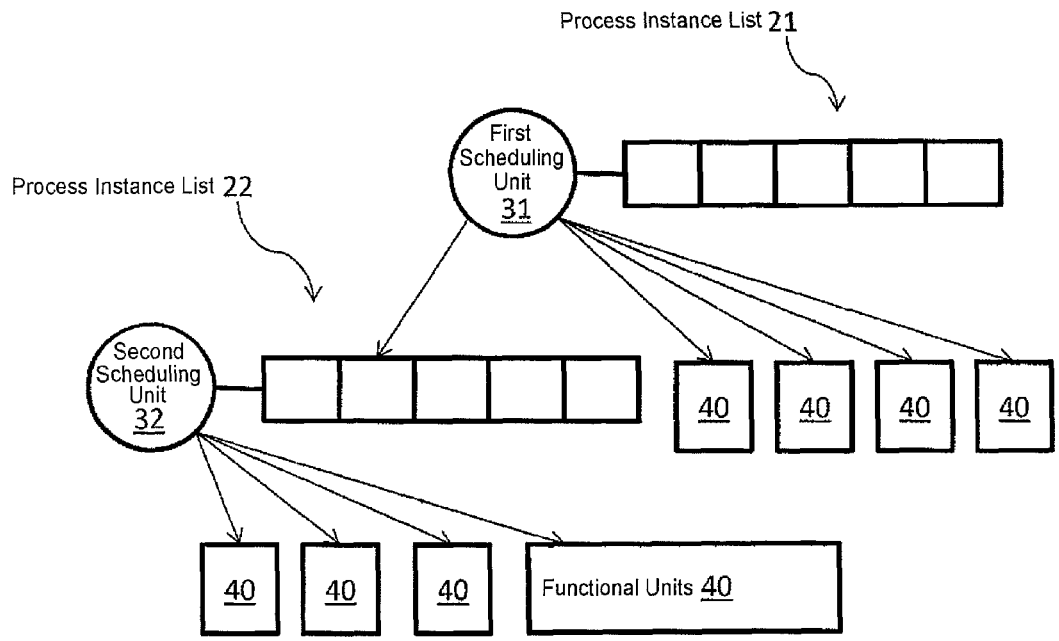
FIG. 2 schematically shows the assignment of a task from one scheduling unit to a different scheduling unit.

FIG. 2 schematically shows the assignment of a process instance from a first scheduling unit 31 to a second scheduling unit 32, where both the first scheduling unit 31 and the second scheduling unit 32 also are capable of assigning process instances to functional units 40. The assignment of a process instance from the first scheduling unit 31 to the second scheduling unit 32 is done by entering the process instance into the process instance list 22 of the second scheduling unit 32. The process instance is deleted from the process instance list 21 of the first scheduling unit 31. The second scheduling unit 32 will assign the process instance to one of its corresponding functional units 40, depending on the scheduling method the second scheduling unit employs; the scheduling methods available to any of the scheduling units in the model are defined when the model is built. The scheduling method employed by a particular scheduling unit at a given time may for example be selected based on pre-defined rules and the state of the system, or may be set by a user of the method, for example. Scheduling units may differ in the scheduling methods available to them. It may of course also be possible that the second scheduling unit 32 is also capable of assigning tasks (process instances) to yet further scheduling units, which may also include the first scheduling unit 31. Taking into account in the simulation the assignment of process instances from one scheduling unit to a different one allows to consider more complex and flexible scheduling approaches, and to thus investigate potential advantageous effects these scheduling approaches have on the performance of, for example, multi-core computer systems, like multi-core embedded systems.

It should be noted that the set of scheduling units a given scheduling unit can assign tasks to may be changed over the course of the simulation, according to rules provided as part of the model of the system. Such a change may for example be triggered by a stimulus or form part of a scheduling scheme employed on the system.

In the example of FIG. 2 it may be possible that the second scheduling unit 32 is realized by a collection of tasks, as has been mentioned above, rather than by a dedicated hardware unit. Among the tasks assigned by the first scheduling unit 31 to functional units 40 then are tasks that perform the scheduling functionality of the second scheduling unit 32.

Figure 3:
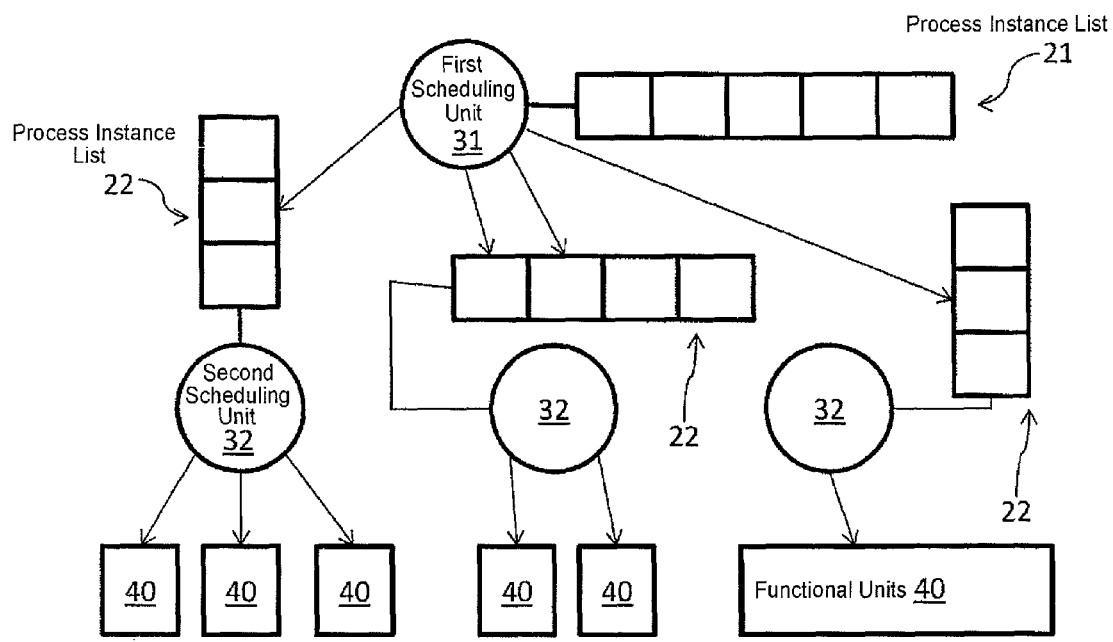
FIG. 3 schematically shows a hierarchical scheduling scheme.

FIG. 3 shows an example of hierarchical scheduling. A first scheduling unit 31 assigns process instances from its process instance list 21 to second scheduling units 32, by entering the respective process instances into the process instance list 22 of the respective second scheduling unit 32. To each second scheduling unit 32 there correspond a number of functional units 40. This number can differ between the second scheduling units 32, as indicated in the drawing. The second scheduling units 32 then assign process instances from their respective process instance list 22 to the respectively corresponding functional units 40. In the hierarchical scheduling approach shown in FIG. 3, the first scheduling unit 31 does not assign tasks to functional units 40.

Figure 4:
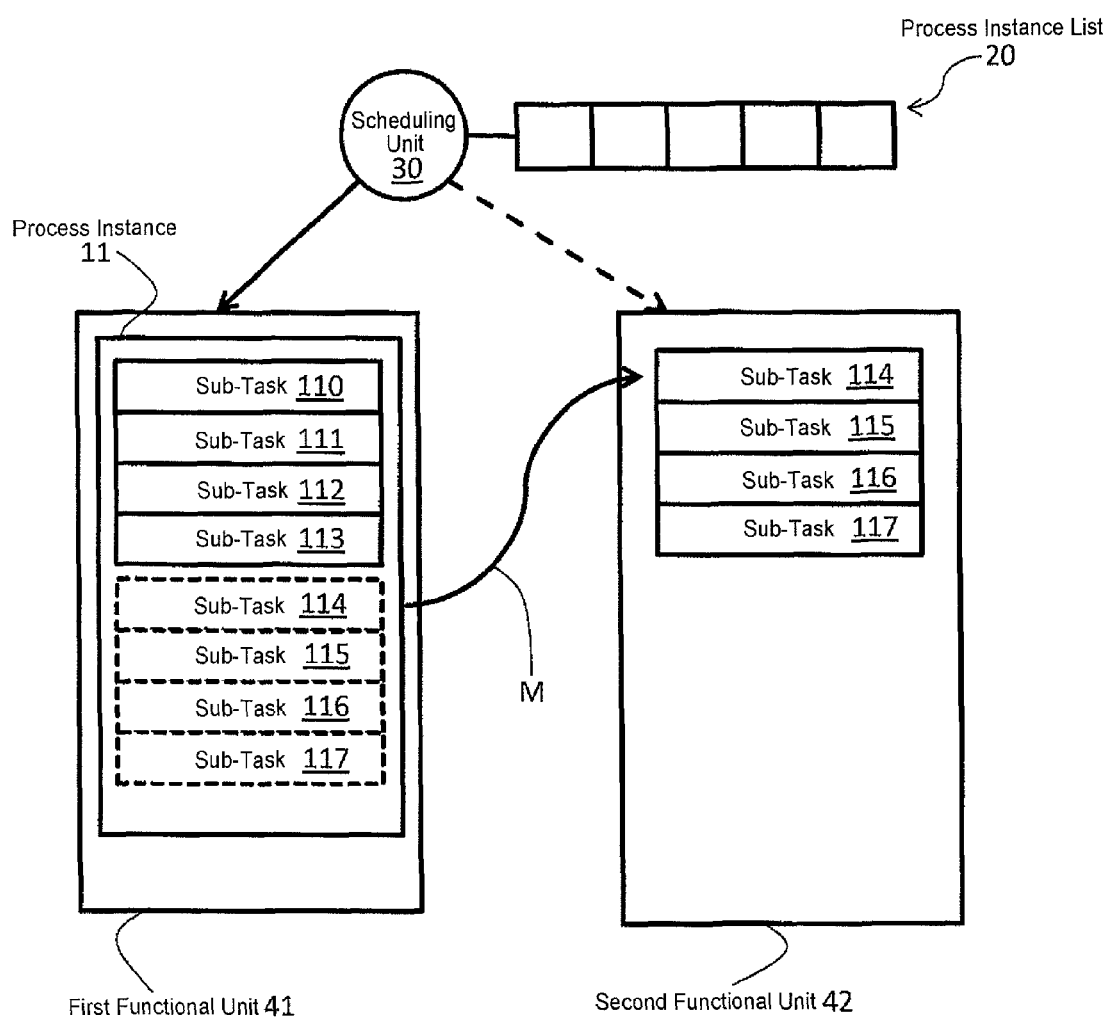
FIG. 4 schematically shows the migration of a task from one functional unit to a different functional unit.

FIG. 4 shows a first functional unit 41 and a second functional unit 42. A scheduling unit 30 is capable of assigning tasks (process instances) to the first functional unit 41 as well as to the second functional unit 42 from its process instance list 20. FIG. 4 illustrates the migration of a task from the first functional unit 41 to the second functional unit 42. The scheduling unit 30 has assigned a process instance 11 to the first functional unit 41. The task or process instance 11 comprises a number of sub-tasks 110, 111, 112, 113, 114, 115, 116, 117, which in principle can be executed one after the other in the order given, unless there are interruptions by stimuli or unless further sub-tasks or process instances are created by at least one of the sub-tasks 110, 111, 112, 113, 114, 115, 116, 117. The subdivision of a task into sub-tasks depends on the one hand on the task in question, and on the other hand on the model itself, i.e. the granularity of the sub-division is model-dependent. The sub-tasks can for example be part of an application software the behavior of which on the system is to be evaluated by the method according to the invention. At least one sub-task may also pertain to functionality of the operating system of the computer system simulated, like for example sending and receiving of signals or reserving of resources like chunks of memory; to this end for example semaphores, mutexes, or locks may be employed. In embodiments of the method according to the invention, the method takes into account the migration of tasks between functional units. Such a migration of a task occurs between sub-tasks of the respective task. In the figure, after execution of the sub-task 113 on the first functional unit 41, the further execution of the task 11, which would continue with sub-task 114, is stopped on the first functional unit 41 by the scheduling unit 30. The scheduling unit 30 then assigns the task 11 to the second functional unit 42, where the execution of the task continues with sub-task 114. The migration of the process instance 11 is also indicated in the figure by the arrow M.

In embodiments it may also be possible for the scheduling unit 30 to create a further process instance corresponding to the non-executed part of the process instance 11 and assign the further process instance to a further scheduling unit by inserting it in the process instance list of the further scheduling unit, or to insert the further process instance in its process instance list 20, thus postponing the execution of the sub-tasks 114, 115, 116, 117, in this example. Taking into account the possibility of a migration of tasks between functional units 41, 42 allows to consider possibly more efficient scheduling approaches. Implementing such scheduling approaches in the real system has the potential to lead to a more efficient use of the functional units of the system and thus to an improved performance of the system.

It should be noted that any form of migration of a task may imply the modification of parameters in the process instance modeling the task, or creating a new process instance modeling the migrated task, in order to obtain a process instance adapted to the target the task is migrated to.

Figure 5:
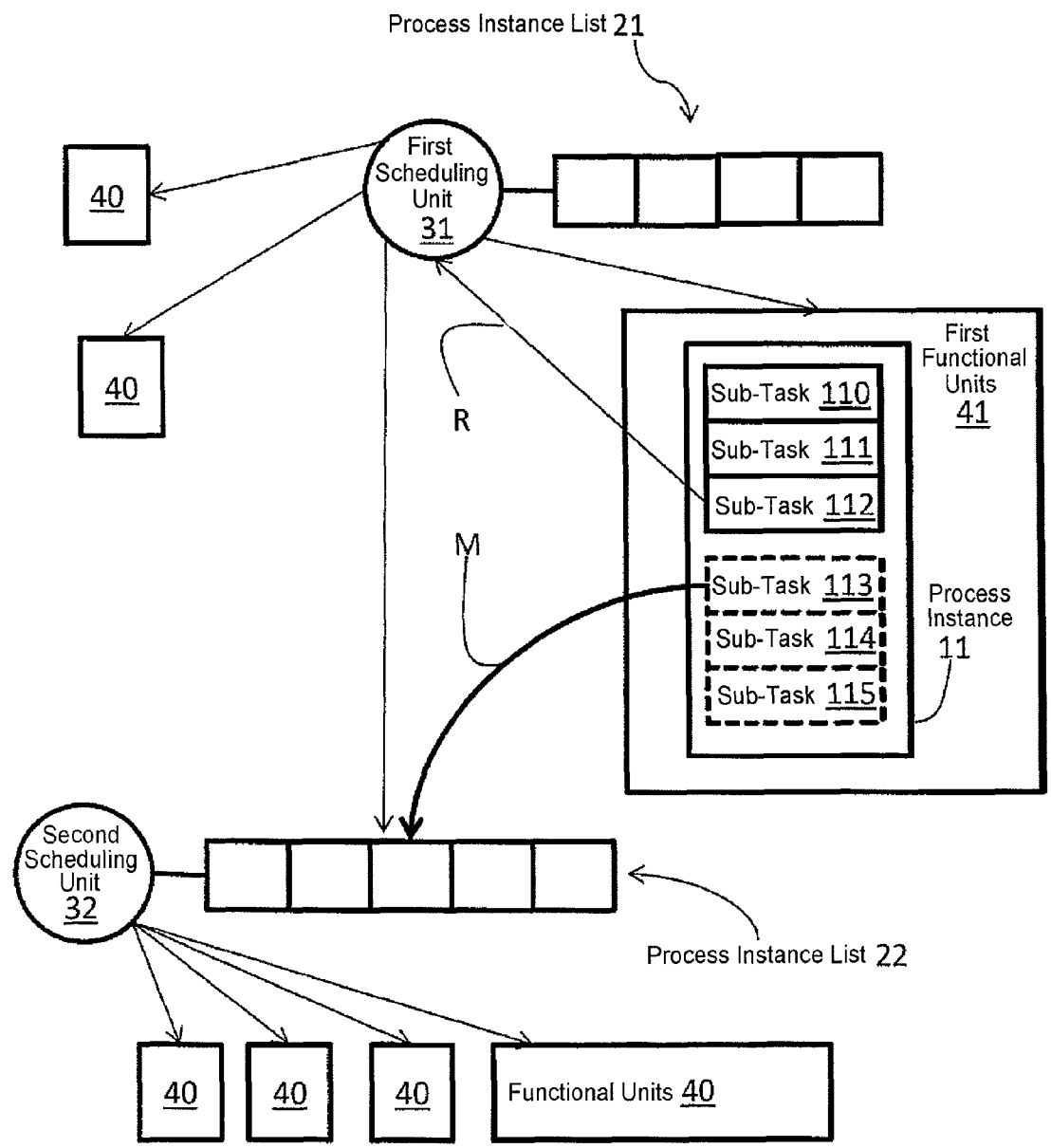
FIG. 5 schematically shows the migration of a task from one scheduling unit to a different scheduling unit.

FIG. 5 to a certain degree is analogous to FIG. 4, but shows the migration, indicated by an arrow M, of a task or process instance 11 from a processing unit 41 of a first scheduling unit 31 to a second scheduling unit 32. In the drawing sub-tasks 110, 111, 112, 113, 114, and 115 of the process instance 11 are shown. After execution of the sub-task 112, the task is migrated to the second scheduling unit 32, by entering it in the process instance list 22 of the second scheduling unit 32. In this example, the migration of the process instance is due to a request from sub-task 112 to the scheduling unit 31. Due to this request, indicated by arrow R, the scheduling unit stops execution of process instance 11 on functional unit 41, and assigns a new process instance, corresponding to the non-executed part of the process instance 11, to the second scheduling unit 32. As an alternative to a request from a sub-task of the task in question, the migration of the task may also be caused by an external or internal stimulus, or by a request from a different task.

Instead of migrating the task from a functional unit 41 corresponding to a first scheduling 31 to a second scheduling unit 32, a task may also be migrated from one functional unit corresponding to a given scheduling unit to a different functional unit corresponding to the same scheduling unit, based on a request from a sub-task of the task, an external or internal stimulus, or a request from a different task.

Yet a further possibility is the migration of a task which currently is not executed from a first scheduling unit 31 to a second scheduling unit 32. Such a migration can be due to an internal or external stimulus, or a request from a different task.

Figure 6:
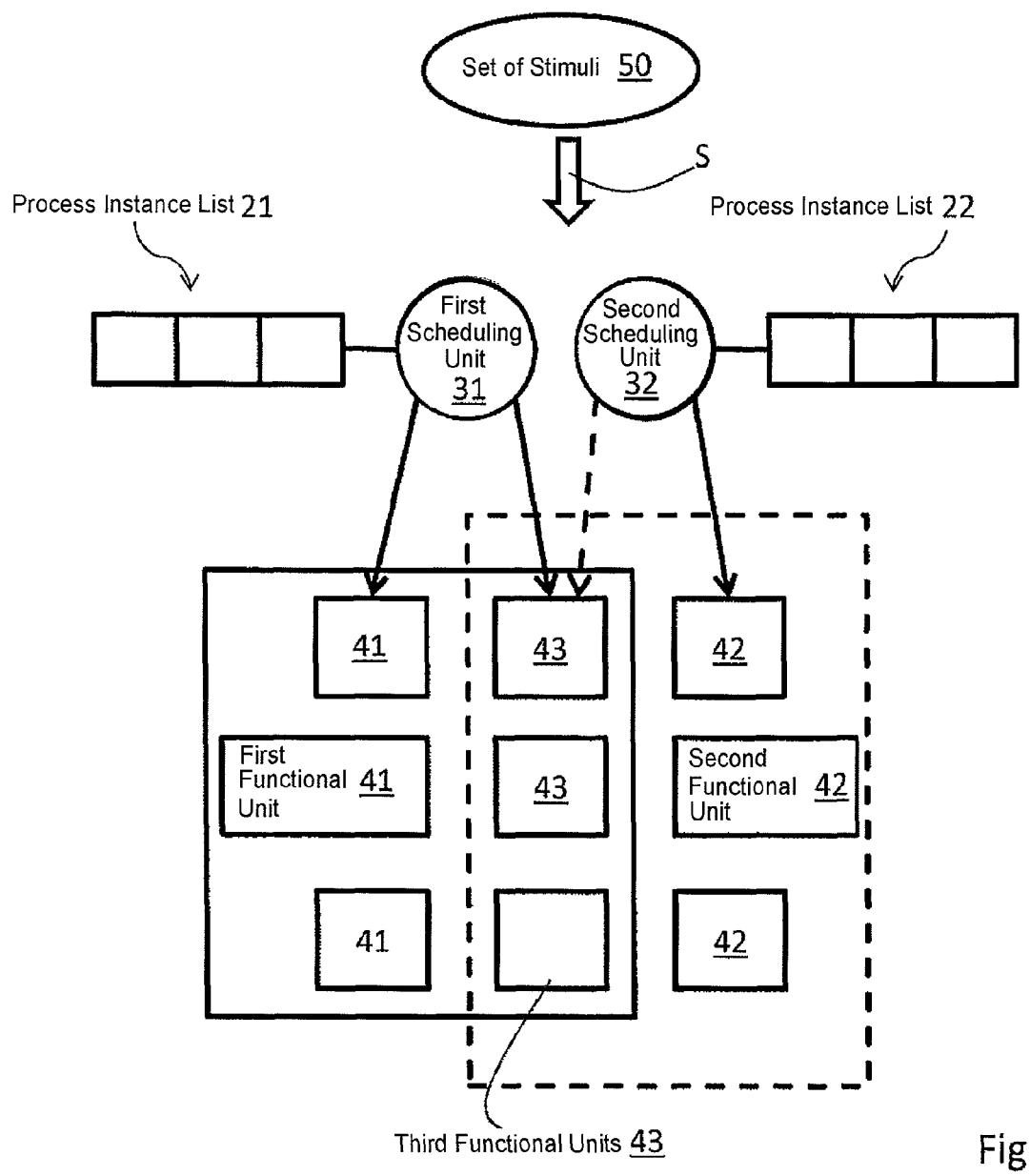

FIG. 6 shows a first scheduling unit 31 with process instance list 21 and a second scheduling unit 32 with process instance list 22. At first, the first scheduling unit is capable of assigning tasks to first functional units 41 and to third functional units 43. The second scheduling unit 32 can assign tasks to second functional units 42. As result of a stimulus from the set of stimuli 50, the correspondence between scheduling units 31, 32 and functional units 41, 42, 43 is changed. After the stimulus, the third functional units 43 are no longer available for the first scheduling unit 31 to assign tasks to, the first scheduling unit 31 now only can assign tasks to the first functional units 41. The second scheduling unit 32, after the stimulus, can assign tasks to the second functional units 42 and in addition to the third functional units 43. This change of correspondence is useful, for example, if the first scheduling unit 31 and the second scheduling unit 32 are responsible for scheduling different kinds of tasks in a system. The first scheduling unit 31 may be scheduling non-critical tasks, which usually require high computing power, but are not relevant under important aspects like safety, in particular under emergency conditions. The second scheduling unit 32, on the other hand, may be responsible for scheduling tasks which most of the time do not require high computing power, but which become particularly important and require increased computing power under exceptional circumstances like an emergency situation. If such exceptional circumstances occur, in the model simulated by the stimulus, the shifting of the third functional units 43 to the second scheduling unit 32 provides such increased computing power. It is of course possible that after the exceptional circumstances have ended or been successfully dealt with by the system, the third functional units 43 are shifted back to the first scheduling unit 41.

Of course, a change of the functional units a given scheduling unit can assign tasks to can also be caused by a request from a specific task or by a scheduling scheme in operation in the system.

Figure 7:
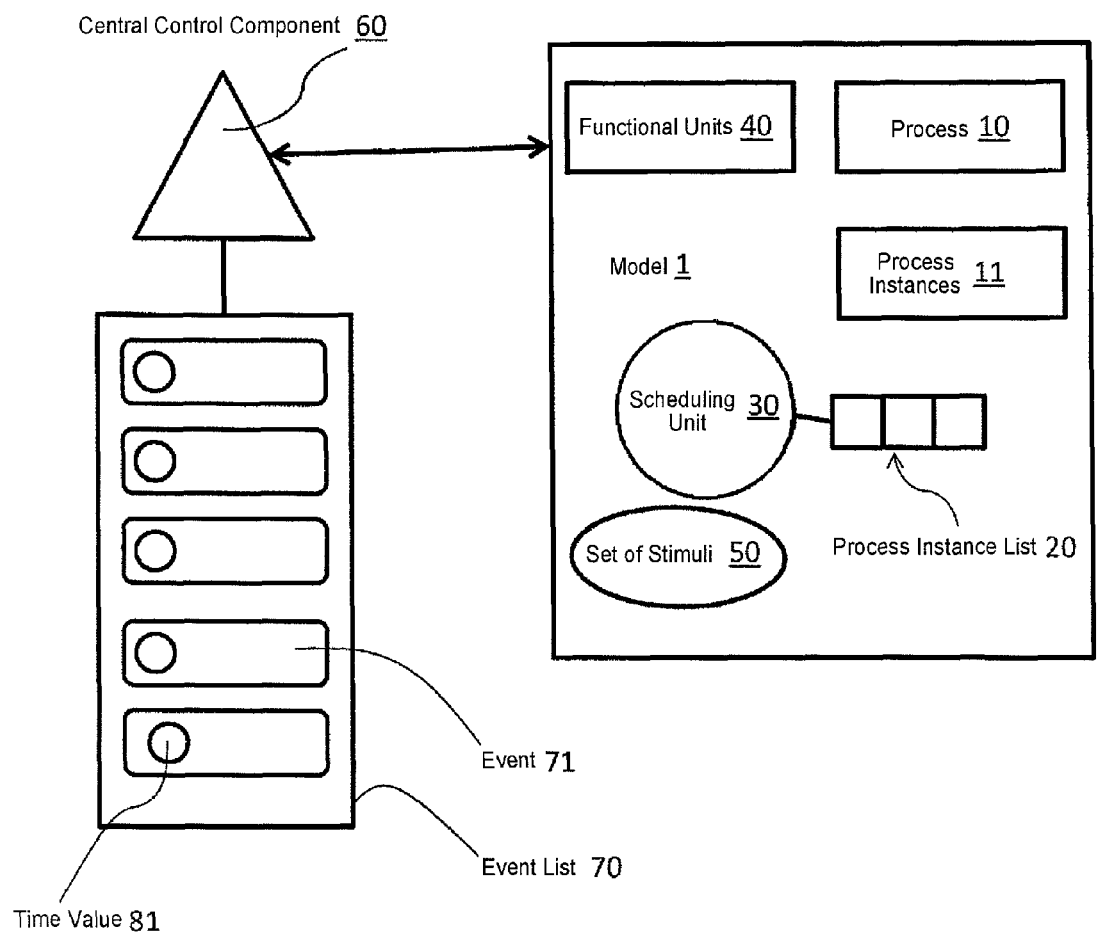
FIG. 7 schematically shows one way of carrying out a simulation of a system.

FIG. 7 illustrates one way of carrying out a simulation of the system. While it is possible in principle to model the hardware and software components involved in the system in a detailed way, this becomes cumbersome even for moderately complex systems. In many cases, such a detailed description of hardware and software components is not necessary, but instead a more abstract approach is considered. Tasks or sub-tasks are assigned costs, wherein such a cost in particular comprises a time required to execute the respective sub-task; for the simulation of computer systems, the time required is usually expressed by the number of cycles necessary to execute the sub-task on a processing unit, and the actual time required results from this number of cycles and the clock cycle of the processing unit the sub-task is executed on. The clock cycle of a processing unit may be changeable. The simulation of a system can then be based on these times; this applies to computer systems but also to systems of different nature. Also, in addition to the time or number of cycles required, further components of the cost of a sub-task may be taken into account.

In FIG. 7 is shown a possibility of realizing a simulation based on the times required to execute sub-tasks. The method of simulation is based on a model 1 of the system to be simulated; such a model has been discussed in the context of FIG. 1. A functional unit 40, a scheduling unit 30 with process instance list 20, a process 10, and a process instance 11, as symbolic representatives of components of the model 1 are shown. The method considers only instants along the (simulated) running of the system simulated by model 1, at which a state of the model 1 changes. The state of the model 1 is a representation of the state of the simulated system within the model 1 of the system adopted for the simulation of the system. Thereunto, the method provides a central control component 60, to which is associated an event list 70 holding a number of events 71. If, for example, a scheduling unit 30 assigns a task to a functional unit 40, a number of events 71 is entered into the event list 70. Each event 71 at least contains a time value 81 indicating a time when there is a possibility for a change of the state of the model 1. Between the times specified by the time values 81, no change of the state of the model 1 is possible. Between these times, a sub-task or number of sub-tasks is executed, though the execution of these sub-tasks need not be simulated in further detail. For the purposes of the embodiment of the method discussed here, only the time required to execute a sub-task on a functional unit 40, as specified by a component of the cost associated with this sub-task is relevant, as from this time-cost the values of time 81, at which a change of the state of the model 1 is possible, are easily obtained by progressing along a simulation time axis by steps the size of which is given by the respective time-cost values. The number of events 71 to be registered with the central control component 60 if a specific task is assigned to a functional unit 40 depends on the structure of the task. If there are stages during the execution of the task, at which the task may be migrated from one functional unit to a different one or at which further tasks or sub-tasks might be generated, an event with a corresponding time value 81 has to be registered for each such stage, for at these stages, evidently, the state of the model 1 may change. Further instants at which the state of the model may change will be evident to a person skilled in the art upon inspection of any specific task at hand. The state of the model 1 may also be changed by a stimulus from the set of stimuli 50. The state of the model 1 comprises at least the assignment of process instances to functional units, the total number of process instances in existence in the model, the correspondence between functional units 40 and scheduling units 30. The state of the model 1 may in addition also contain model specific parameters, for example a temperature of at least one component of the system; this may be advantageous if thermal considerations are important in the simulated system. In such a case the state of the model 1 also changes when certain temperature values are reached. The instants of time when this occurs can be deduced, for example, based on the energy component of the cost of sub-tasks, which already has been mentioned above.

The central control component 60 keeps the list of events 70 ordered by increasing time values 81. The central control component 60 proceeds through the list 70 and for each event 71 processes the event 71. Processing an event 71 comprises checking the state of the model 1. Depending on the result of such a check, further events 71 may have to be sorted into the list 70; this may be the case, for example, if further process instances 11 have been created. Events 71 which have been processed are deleted from the list 70.

If the clock cycle of at least one functional unit 40 is changed, the time values 81 of the events 71 in the list 70 have to be recalculated, and the list 70 afterwards possibly reordered.

The state of the model 1 can be monitored, and quantities of interest can be derived from the state of the model 1, so that the design of the modeled system can be evaluated. These quantities may include, but are not limited to, the total time required to perform certain tasks, the keeping of certain deadlines or reaction-time limits, the temperatures of components of the system, the energy consumption of the entire system or of components thereof.

The invention has been described with reference to specific embodiments. It is evident to a person skilled in the art that alterations and modifications can be made without leaving the scope of the subsequent claims.

What is claimed is:

1. A method for the design evaluation of a system comprising the following steps:

providing the system with at least two functional units, each functional unit capable of performing at least one type of task, and at least one scheduling unit capable of assigning at least one task to at least one functional unit, the at least one scheduling unit capable of assigning tasks to plural targets, each target being either a functional unit of the at least two functional units or a further scheduling unit of the at least one scheduling unit;

providing as a set of parameters a description of the system to at least one computer;

running a simulation of the system on the at least one computer;

generating output representing simulation results; and taking into account in the simulation the capability of the at least one scheduling unit for removing a task from a target of the targets and assigning the task to a different target, the method providing a central control component to which is associated an event list holding a number of events for a model of the system being simulated, each event at least containing a time value indicating a time when a state of the model of the system is changeable, the number of events registerable with the central control component for a specific task assigned to a functional unit depending on the structure of the task, wherein the state of the model of the system comprises at least the assignment of process instances to functional units, the total number of process instances in existence in the model, and a correspondence between the at least two functional units and the at least one scheduling unit, a process instance being a representation of a task, and wherein the central control component for performing the simulation keeps the event list ordered by increasing time values, proceeds through the event list, and for each event processes the event, the processing of each event comprising checking the state of the model and deleting each event after the event has been processed.

2. The method as recited in claim 1 wherein a possibility of a change of targets is taken into account in the simulation for the at least one scheduling unit, wherein the at least one scheduling unit can assign tasks to.

3. The method as recited in claim 1 wherein a task is broken down into at least one sub-task to a degree predefined by a user of the method, and the removing the task from a target and assigning the task to a different target occurs between the execution of sub-tasks of the respective task.

4. The method as recited in claim 1 wherein each task is assigned a cost.

5. The method as recited in claim 4 wherein the cost assigned is a fixed value, or a value sampled from a distribution, or a value derived from at least one parameter assigned to the task and a state of the simulated system.

6. The method as recited in claim 3 wherein each sub-task is assigned a cost.

7. The method as recited in claim 6 wherein the cost assigned is a fixed value, or a value sampled from a distribution, or a value derived from at least one parameter assigned to the sub-task and a state of the simulated system.

8. The method as recited in claim 1 wherein the simulation takes into account events generated outside the system.

9. The method as recited in claim 1 wherein the system is a computer system and the functional units are selected from the group consisting of: a processing unit, a storage element, and a bus element.

10. The method as recited in claim 1 wherein each task is broken down into at least one sub-task, and each sub-task is assigned a cost, wherein the cost comprises at least one of: at least a number of cycles required to execute the sub-task and a value of an energy required to execute the respective sub-task.

11. The method as recited in claim 1 wherein the simulation takes into account the possibility of changing a clock cycle of at least one functional unit.

12. The method as recited in claim 1 wherein the at least one computer is an embedded system.

13. The method as recited in claim 1 wherein the system is a transport network, the functional units are connections in the transport network, and the at least one scheduling unit selects alternative connections between given nodes of the network.

14. The method as recited in claim 1 wherein each of the at least two functional units is a production or manufacturing device configured to perform at least one task within a manufacturing process, and the at least one scheduling unit distributes workload to the production or manufacturing devices.

15. The method as recited in claim 1 wherein the system is an energy supply system, each of the at least two functional units is an energy production unit, or an energy storage unit, or an energy transfer unit, or an energy consumer, and the at least one scheduling unit controls the production of energy, as well as a distribution of energy via energy transfer units to energy storage units and to energy consumers.

16. A method for optimizing a system, the system having at least two functional units, each functional unit capable of performing at least one type of task, and at least one scheduling unit capable of assigning at least one task to at least one functional unit of the at least two functional units, the at least one scheduling unit capable of assigning tasks to plural targets, each target being either a functional unit of the at least two functional units or a further scheduling unit of the at least one scheduling unit, the method comprising the steps of:

defining optimization targets, providing as a set of parameters a description of the system to at least one computer; running a simulation of the system on the at least one computer; generating output representing simulation results;

taking into account in the simulation the capability of the at least one scheduling unit for removing a task from a target of the targets and assigning the task to a different target; evaluating the simulation results; and modifying the set of parameters describing the system for the simulation depending on the simulation results, and the simulation is reiterated, until optimization targets are achieved to a degree desired by a user, the simulation method providing a central control component to which is associated an event list holding a number of events for a model of the system being simulated, each event at least containing a time value indicating a time when a state of the model of the system is changeable, the number of events registerable with the central control component for a specific task assigned to a functional unit depending on the structure of the task, wherein the state of the model of the system comprises at least the assignment of process instances to functional units, the total number of process instances in existence in the model, and a correspondence between the at least two functional units and the at least one scheduling unit, a process instance being a representation of a task; and wherein the central control component, for performing the simulation keeps the event list ordered by increasing time values, proceeds through the event list, and for each event processes the event, the processing of each event comprising checking the state of the model and deleting each event after the event has been processed.

* * * * *